US012136681B2

(12) United States Patent
Wang et al.

(10) Patent No.: US 12,136,681 B2
(45) Date of Patent: Nov. 5, 2024

(54) METHOD AND APPARATUS FOR CONTROL AND SUPPRESSION OF STRAY LIGHT IN A PHOTONIC INTEGRATED CIRCUIT

(71) Applicant: EMCORE Corporation, Alhambra, CA (US)

(72) Inventors: Liming Wang, Tinley Park, IL (US); Martin A. Kits van Heyningen, Newport, RI (US)

(73) Assignee: EMCORE Corporation, Alhambra, CA (US)

( * ) Notice: Subject to any disclaimer, the term of this patent is extended or adjusted under 35 U.S.C. 154(b) by 1008 days.

(21) Appl. No.: 16/670,267

(22) Filed: Oct. 31, 2019

(65) Prior Publication Data

US 2020/0135960 A1   Apr. 30, 2020

Related U.S. Application Data

(60) Provisional application No. 62/753,430, filed on Oct. 31, 2018.

(51) Int. Cl.
*G02B 6/122* (2006.01)
*G01C 19/58* (2006.01)
(Continued)

(52) U.S. Cl.
CPC .............. *H01L 31/12* (2013.01); *G01C 19/58* (2013.01); *G02B 6/122* (2013.01); *G02B 2006/12126* (2013.01)

(58) Field of Classification Search
CPC ......... H01L 31/12; G01C 19/58; G02B 6/122; G02B 2006/12126; G02B 6/1228;
(Continued)

(56) References Cited

U.S. PATENT DOCUMENTS

| 4,420,259 A | 12/1983 | Taylor |
| 4,678,267 A | 7/1987 | Burns |

(Continued)

FOREIGN PATENT DOCUMENTS

| CN | 205720760 U | 11/2016 |
| CN | 107843957 A | 3/2018 |

(Continued)

OTHER PUBLICATIONS

Humaira, Z., et al: "Integrated silicon photonic TE-pass polarizer", 2016 Photonics North (PN), IEEE, May 24, 2016 (May 24, 2016).

(Continued)

*Primary Examiner* — Sung H Pak
(74) *Attorney, Agent, or Firm* — Hamilton, Brook, Smith & Reynolds, P.C.

(57) ABSTRACT

In a photonic integrate circuit (PIC) architecture, non-guided stray light that is radiated from components, junctions, discontinuous and scattering points in an integrated optic device, may be received by an integrated waveguide structure in the path of the stray radiation. The integrated waveguide structure may comprise a plurality of collectors that are configured to collect the non-guided stray light from the radiating source. Each of the collectors may comprise an integrated waveguide with a front end that is tapered to increase the mode-field size and pointed toward the stray light source, and with a back end that is connected to a secondary waveguide. The collectors are placed in the path of the stray light and aligned in the propagation direction of the stray light. The collected stray light is guided to a light energy damper through the second waveguide for converting light energy into heat.

12 Claims, 8 Drawing Sheets
(8 of 8 Drawing Sheet(s) Filed in Color)

(51) Int. Cl.
*G02B 6/12* (2006.01)
*H01L 31/12* (2006.01)

(58) Field of Classification Search
CPC .............. G02B 6/125; G02B 6/126; G02B 2006/12116; G02B 2006/12119; G02B 2006/12147; G02B 2006/12195; G02B 6/12004
USPC ............... 385/14–15, 30–32, 45, 129–132
See application file for complete search history.

(56) References Cited

U.S. PATENT DOCUMENTS

| | | |
|---|---|---|
| 4,842,358 A | 6/1989 | Hall |
| 4,890,922 A | 1/1990 | Wilson |
| 4,915,503 A | 4/1990 | Pavlath |
| 4,938,594 A | 7/1990 | Pavlath |
| 4,969,742 A | 11/1990 | Falk |
| 5,037,205 A | 8/1991 | Pavlath |
| 5,194,917 A | 3/1993 | Regener |
| 5,223,911 A | 6/1993 | Suchoski |
| 5,321,503 A | 6/1994 | Bramson |
| 5,363,457 A | 11/1994 | Falt et al. |
| 5,365,338 A | 11/1994 | Bramson |
| 5,393,371 A | 2/1995 | Chang et al. |
| 5,436,992 A | 7/1995 | Wang |
| 5,475,771 A | 12/1995 | Hosoi |
| 5,537,671 A | 7/1996 | Toyama et al. |
| 5,579,424 A | 11/1996 | Schneider |
| 5,600,745 A | 2/1997 | Wuu |
| 5,627,644 A | 5/1997 | Sanders |
| 5,729,641 A | 3/1998 | Chandonnet |
| 5,838,844 A | 11/1998 | Van Dam |
| 5,909,305 A | 6/1999 | Kinoshita |
| 5,946,434 A | 11/1999 | Lee |
| 5,982,961 A | 11/1999 | Pan |
| 6,108,086 A | 8/2000 | Michal |
| 6,140,009 A | 10/2000 | Wolk |
| 6,163,632 A | 12/2000 | Rickman |
| 6,293,688 B1 | 9/2001 | Deacon |
| 6,298,178 B1 * | 10/2001 | Day .............. G02B 6/125 385/129 |
| 6,360,038 B1 | 3/2002 | Grubsky |
| 6,445,455 B1 | 9/2002 | Hall |
| 6,584,240 B2 | 6/2003 | Doi et al. |
| 6,680,472 B1 | 1/2004 | Thingboet |
| 6,760,520 B1 | 7/2004 | Medin |
| 6,778,751 B2 | 8/2004 | Tada et al. |
| 6,905,904 B2 | 6/2005 | Gardner |
| 6,920,257 B1 | 7/2005 | Mekis |
| 7,061,610 B2 | 6/2006 | Mittelstein |
| 7,085,441 B1 | 8/2006 | Kozlov |
| 7,218,809 B2 | 5/2007 | Zhou |
| 7,224,878 B1 | 5/2007 | Wessels |
| 7,426,326 B2 | 9/2008 | Moeller et al. |
| 7,711,214 B2 | 5/2010 | Tsuzuki et al. |
| 7,783,146 B2 | 8/2010 | Blauvelt et al. |
| 7,899,286 B2 | 3/2011 | Yoshida |
| 8,121,874 B1 | 2/2012 | Guheen et al. |
| 9,411,098 B2 | 8/2016 | Onaka |
| 9,664,931 B1 | 5/2017 | Yap et al. |
| 9,690,045 B2 | 6/2017 | Goodwill et al. |
| 9,739,938 B2 | 8/2017 | Shi |
| 9,746,612 B2 | 8/2017 | Lipson |
| 9,952,456 B2 | 4/2018 | Huang |
| 10,018,789 B2 | 7/2018 | Wang et al. |
| 10,108,789 B2 | 10/2018 | Lehmann et al. |
| 10,274,319 B2 | 4/2019 | Wang |
| 10,488,596 B2 | 11/2019 | Akiyama |
| 10,545,288 B2 | 1/2020 | Ma |
| 10,921,682 B1 | 2/2021 | Wang |
| 11,092,748 B2 | 8/2021 | Wang |
| 11,320,267 B2 | 5/2022 | Wang |
| 11,353,655 B2 | 6/2022 | Wang |
| 11,415,419 B2 | 8/2022 | Wang et al. |
| 2002/0003918 A1 | 1/2002 | Poi |
| 2002/0197037 A1 | 1/2002 | Bailey |
| 2002/0024786 A1 | 2/2002 | Sanders |
| 2002/0149780 A1 | 10/2002 | Trinh |
| 2003/0081902 A1 | 5/2003 | Blauvelt |
| 2004/0057667 A1 | 3/2004 | Yamada |
| 2004/0168234 P1 | 8/2004 | Fischer |
| 2004/0223695 A1 | 11/2004 | Kersten et al. |
| 2005/0021348 A1 | 1/2005 | Chan et al. |
| 2005/0025427 A1 | 2/2005 | Dougherty |
| 2006/0133754 A1 | 6/2006 | Patel et al. |
| 2006/0251849 A1 | 11/2006 | Blauvelt |
| 2007/0053625 A1 | 3/2007 | Ichioka |
| 2007/0229838 A1 | 10/2007 | Greening |
| 2008/0024786 A1 | 1/2008 | Sanders |
| 2008/0166095 A1 | 7/2008 | Popovic et al. |
| 2008/0291459 A1 | 11/2008 | Meyer |
| 2009/0087144 A1 | 4/2009 | Yoshida |
| 2009/0190876 A1 | 7/2009 | Doi |
| 2010/0137849 A1 | 6/2010 | Hanft et al. |
| 2011/0064355 A1 * | 3/2011 | Soma .............. G02B 6/12019 385/38 |
| 2012/0217419 A1 | 8/2012 | Riesen et al. |
| 2013/0202250 A1 | 8/2013 | Guattari |
| 2013/0308897 A1 | 11/2013 | Sercel |
| 2014/0075357 A1 | 3/2014 | Flores et al. |
| 2014/0185979 A1 | 7/2014 | Evans |
| 2014/0376001 A1 | 12/2014 | Swanson |
| 2014/0376083 A1 | 12/2014 | Onaka |
| 2015/0021291 A1 | 1/2015 | Shastri |
| 2015/0205181 A1 * | 7/2015 | Kondou .............. G02F 1/225 385/3 |
| 2015/0212271 A1 | 7/2015 | Chen |
| 2015/0027042 A1 | 10/2015 | Goodwill |
| 2015/0277042 A1 | 10/2015 | Goodwill et al. |
| 2015/0277156 A1 * | 10/2015 | Kondou .............. G02F 1/0356 385/2 |
| 2016/0357085 A1 * | 12/2016 | Jewart .............. G02B 6/122 |
| 2017/0131472 A1 | 5/2017 | Kobyakov |
| 2017/0168234 A1 | 6/2017 | Shi |
| 2017/0192171 A1 | 7/2017 | Shi |
| 2017/0205578 A1 | 7/2017 | Van Thourhout |
| 2017/0205583 A1 | 7/2017 | Bennett |
| 2017/0329082 A1 | 11/2017 | Ma |
| 2018/0120504 A1 | 5/2018 | Qi |
| 2018/0259337 A1 | 9/2018 | Wang |
| 2018/0274926 A1 | 9/2018 | Wang |
| 2019/0086614 A1 | 3/2019 | Wang |
| 2020/0116489 A1 | 4/2020 | Wang et al. |
| 2020/0371286 A1 | 11/2020 | Wang |
| 2021/0048721 A1 | 2/2021 | Wang |
| 2021/0240050 A1 | 8/2021 | Khan |
| 2023/0049259 A1 | 2/2023 | Khan et al. |
| 2023/0168090 A1 | 6/2023 | Khan et al. |

FOREIGN PATENT DOCUMENTS

| | | |
|---|---|---|
| CN | 112833873 A | 5/2021 |
| EP | 0279603 A2 | 8/1988 |
| EP | 0893671 | 1/1990 |
| EP | 0379520 A1 | 8/1990 |
| EP | 0883000 A1 | 12/1998 |
| EP | 1025422 A1 | 8/2000 |
| EP | 1396741 A1 | 3/2004 |
| EP | 2096408 A2 | 4/2008 |
| EP | 2246663 A2 | 11/2010 |
| EP | 3454101 A1 | 3/2019 |
| GB | 2201256 A | 8/1988 |
| JP | 63-070114 | 3/1988 |
| JP | 02-275402 A | 11/1990 |
| JP | 02-504080 A | 11/1990 |
| JP | 05-224045 A | 9/1993 |
| JP | 07-022674 A | 1/1995 |
| JP | H09159865 A | 6/1997 |
| JP | 2006-276518 A | 10/2006 |
| JP | 2007-025583 A | 2/2007 |
| JP | 20070272121 A | 10/2007 |
| JP | 2009-103792 A | 5/2009 |
| JP | 2012-078508 A | 4/2012 |

(56) References Cited

FOREIGN PATENT DOCUMENTS

| | | |
|---|---|---|
| JP | 20120215901 A | 11/2012 |
| JP | 2013255086 A | 12/2013 |
| JP | 2017-518524 A | 7/2017 |
| KR | 10-1990-0008876 B1 | 12/1990 |
| KR | 10-1999-0014060 A | 2/1999 |
| WO | 89/10534 A1 | 11/1989 |
| WO | 198901534 A1 | 11/1989 |
| WO | 8912082 | 12/1989 |
| WO | 2015/008451 A1 | 1/2015 |
| WO | 2015108488 A1 | 7/2015 |
| WO | 2016010528 A1 | 1/2016 |
| WO | 2018165238 A1 | 9/2018 |
| WO | 2018175524 A1 | 9/2018 |
| WO | 2019055663 A1 | 3/2019 |
| WO | 2020077216 A1 | 4/2020 |
| WO | 2020092789 A1 | 5/2020 |
| WO | 2020/236569 A1 | 11/2020 |
| WO | 2021/034560 A1 | 2/2021 |
| WO | 2021154970 A1 | 8/2021 |

OTHER PUBLICATIONS

Tan, Y. et al.: "Polarization-selective microring resonators", Optics Express, vol. 25, No. 4, Feb. 15, 2017 (Feb. 15, 2017).

International Search Report and Written Opinion for PCT/US2019/059195 dated Jan. 16, 2020 entitled "Method and Apparatus for Control and Suppression of Stray Light in a Photonic Integrated Circuit".

International Preliminary Report on Patentability for PCT/US2020/045877 dated Mar. 3, 2022 titled "Integrated Optical Phase Modulator and Method of Making Same".

International Preliminary Report on Patentabiilty for PCT/US2019/059195 dated May 14, 2021 titled "Method and Apparatus For Control and Suppression of Stray Light in a Photonic Integrated Circuit".

Hochberg, M., et al., "Silicon photonics: the next fabless semiconductor industry", IEEE Solid-State Circuits Magazine, IEEE, USA, vol. 5, No. 1, Mar. 1, 2013.

Sanders, G., et al., "Improvements to Signal Processing and Component Minaturization of Compact Resonator Fiber Optic Gyroscopes", 2018 DGON Inertial Sensors and Systems (ISS), IEEE, Sep. 11, 2018.

Steier, W.H., et al., "Polymer Electro-Optic Devices for Integrated Optics", Chemical Physics, Amsterdam, NL, vol. 245, No. 1-03, Jul. 1, 1999.

International Search Report and Written Opinion for PCT/US2021/015454 dated Jun. 15, 2021 titled "Integrated Modulator Structure for In-situ Power Balancing in Photonic Fiber Optic Gyroscopes".

Bauters, et al., "Ultralow-Loss Planar Si3N4 Waveguide Polarizers," IEEE Photonics Journal, 5(1), Article S/N: 6600207 (2013).

Cheng, Z.J., et al., "Polymer-waveguide-based vertical coupler", Optics Communications, vol. 260, No. 2, Apr. 15, 2006.

Florjanczyk, M., et al., "Tiny spectrometer enables cost-effective space-borne sensing" SPIE Newsroom, 10.1117/2.1200912.002524, 2009.

Garanovich, I., et al., "Nonlinear directional coupler for polychromatic light", Optics Letters vol. 32, Issue 5, pp. 475-477 (2007).

Hammer, M., et al., "Hybrid coupled-mode modeling in 3D: perturbed and coupled channels, and waveguide crossings", Journal of Optical Society of America, vol. 34, No. 3, Mar. 1, 2017.

Hatta, A.M., et al., "A simple integrated ratiometric wavelength monitor based on a directional coupler", Optik 125 (2014) 795-798.

Hatta, A.M., et al. "Design of the optical core of an integrated ratiometric wavelength monitor" Proceedings 14th European Conference on Integrated Optics: ECIO 08 Eindhoven: Jun. 11-13, 2008, Eindhoven University of Technology, The Netherlands, paper, ThP25.

Lallier, E., et al., "Laser Oscillation of Single-Mode Channel Waveguide in ND:MGO:LINB03", Electronic Letters, IEEE Stevenage, GB, vol. 26, No. 22, Oct. 26, 1989.

Leijtens, X., et al., "Arrayed Waveguide Gratings", in "Wavelength Filters in Fibre Optics", vol. 123 of the series Springer Series in Optical Sciences pp. 125-187 (date uknown).

Muneeb, M., et al., "Silicon-on-insulator shortwave infrared wavelength meter with integrated photodiodes for on-chip laser monitoring", Nov. 3, 2014 | vol. 22, No. 22 | DOI: 10.1364/OE.22.027300 | Optics Express 27300.

Seyringer, D., et al., "Arrayed Waveguide Gratings", SPIE Press Book, Date Published: Jun. 3, 2016, ISBN: 9781510603608, vol. SL16.

Shang. K., et al., "Low-loss compact multilayer silicon nitride platform for 3D photonic integrated circuits" Optics Express, vol. 23, No. 16, Aug. 6, 2015.

Srinivasan, S., et al., "Design of integrated hybrid silicon waveguide optical gyroscope", Optics Express 24988, vol. 22, No. 21, Oct. 20, 2014.

Tran, M., et al., "Integrated optical driver for interferometric optical gyroscopes", Optics Express 3827, vol. 25, No. 4. Feb. 20, 2017.

Wang, P., et al., "Passive photonic integrated ratiometric wavelength monitor with resolution better than 15 pm", vol. 25, No. 3 | Feb. 6, 2017 | Optics Express 2940.

Wang, P., et al. "Wavelength Measurement Based on a Silicon-on-Insulator Directional Coupler Integrated Device", Sensors 2015, 15 21281.

Yu, C., et al., "Stable and Compact Optical Module for Fiber-Optic Gyroscope Application", Fiber and Integrated Optics, 33:306-314, 2014.

International Search Report and Written Opinion for PCT/US2018/021262 dated Jun. 15, 2018 entitled "Photonic Integrated Circuit For an Interference Fiber Optic Gyroscope (IFOG)".

International Search Report and Written Opinion for PCT/US2018/023472 dated Jun. 29, 2018 entitled" Integrated Optic Wavemeter And Method For Fiber Optic Gyroscopes Scale Factor Stabilization".

International Search Report and Written Opinion for PCT/US2018/050896 dated Jan. 7, 2019 entitled " Method and Apparatus for Self-Alignment Connection of Optical Fiber to Waveguide of Photonic Integrated Circuit".

International Search Report and Written Opinion for PCT/US2019/055849 dated Mar. 11, 2020, titled " Photonic Integrated Circuits, Fiber Optic Gyroscopes and Methods for Making the Same".

International Search Report and Written Opinion for PCT/US2020/033092 dated Sep. 4, 2020 titled "Integrated Optical Polarizer and Method of Making Same".

Lu, M et al., "Field Patterns of the TE Modes in Ridge-Trough Waveguide", International Journal of Infrared and Millimeter Waves, Kluwer Academic Publishers-Plenum Publishers, NE, vol. 23, No. 8, Aug. 1, 2002.

Pu, M et al., "Ultra-low-loss inverted taper coupler for silicon-on-insulator ridge waveguide", Optics Communications, Elsevier, Amsterdam, NL, vol. 283, No. 19, Oct. 1, 2010.

International Search Report and Written Opinion for PCT/US2020/045877 dated Nov. 9, 2020 titled "Integrated Optical Phase Modulator and Method of Making Same".

International Preliminary Report on Patentability for PCT/US2019/055849 dated Apr. 8, 2021, titled " Photonic Integrated Circuits, Fiber Optic Gyroscopes and Methods for Making the Same".

International Preliminary Report on Patentability for PCT/US2020/033092 dated Dec. 2, 2021 titled " Integrated Optical Polarizer and Method of Making Same".

International Preliminary Report on Patentability received for PCT Patent Application No. PCT/US2021/015454, mailed on Aug. 11, 2022, 11 pages.

Park, H., et al. "Device and Integratino Technology for Silicon Photonic Transmitters", IEEE Journal of Selectred Topics in Quantum Electronics, vol. 17, No. 3, May/Jun. 2011.

Ren, T., et al., "An Integrated Low-Voltage Broadband Lithium Niobate Phase Modulator", IEEE Photonics Technology Letters, vol. 31, No. 11, Jun. 1, 2019.

(56) References Cited

OTHER PUBLICATIONS

International Search Report and Written Opinion received for PCT Patent Application No. PCT/US2022/080549, mailed on Dec. 13, 2023, 14 pages.

* cited by examiner

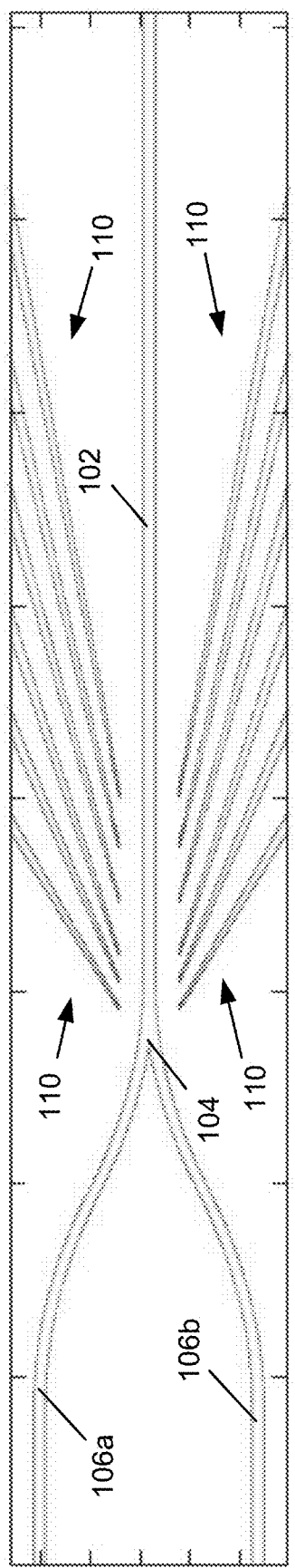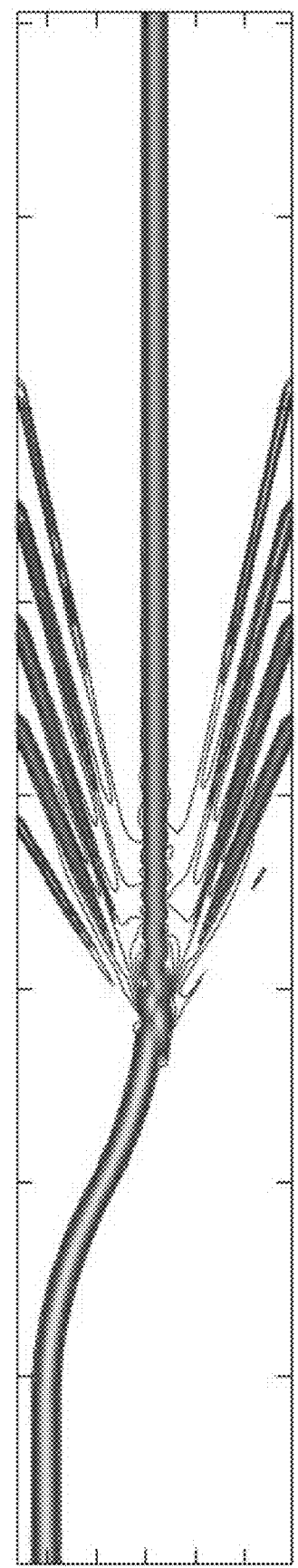
FIG. 1C
FIG. 1D

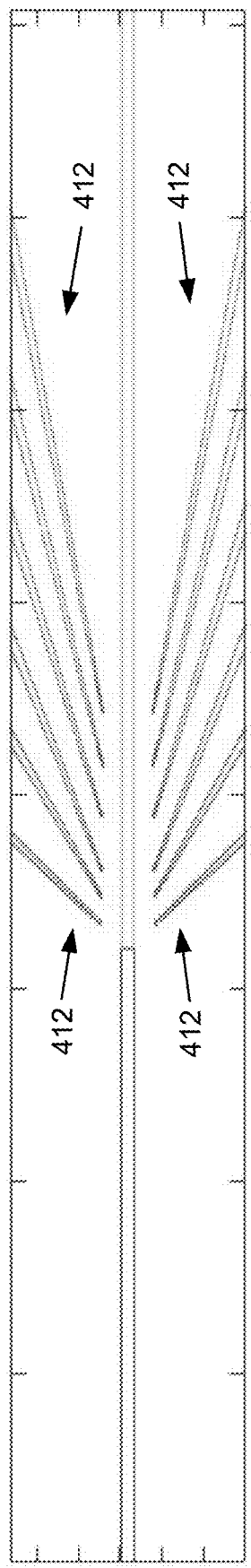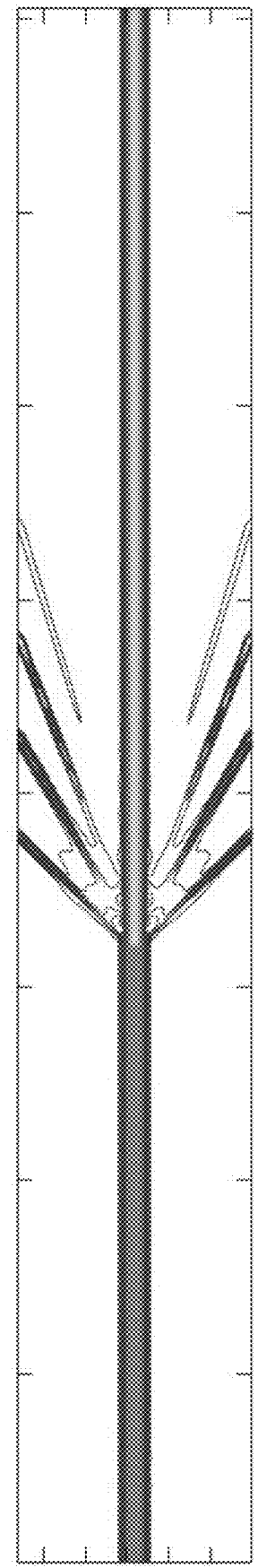
FIG. 4C
FIG. 4D

METHOD AND APPARATUS FOR CONTROL AND SUPPRESSION OF STRAY LIGHT IN A PHOTONIC INTEGRATED CIRCUIT

RELATED APPLICATION

This application claims the benefit of U.S. Provisional Application No. 62/753,430, filed on Oct. 31, 2018. The entire teachings of the above application are incorporated herein by reference.

BACKGROUND

A photonic integrated circuit (PIC) is suitable for mass production and can achieve a significant economy of scale. Silicon-based PICs may benefit from well-developed fabrication experience, technology, and scalability already for silicon-based microelectronics industry. A PIC may comprise two or more optical components integrated on a same substrate, for example a semiconductor wafer. The optic components may perform different or same functions (e.g., splitter, combiner, coupler, interferometer, modulator, filter, isolator, delay line, among others) to build an optical system. Optic waveguides may be utilized to link the optic components to conduct optical signals between them. The components may be connected in parallel or in series.

Non-guided stray light in radiation mode may be generated by the individual components or by waveguides. One example of the stray light source may be a Y-junction combiner, such as is implemented at the output end of an integrated Mach-Zehnder interferometer used in an optical modulator, or for a Sagnac interferometer used in a fiber optic gyroscope. When light modes in the two branch waveguides of the Y-junction are in opposite phase, the combined light is not in a fundamental mode and so is not guided in the common base waveguide. Instead, the light is coupled into a radiative mode, which causes the light to scatter throughout the photonic integrated circuit. The non-guided stray light may stay in the same plane of the optical system or may be reflected and refracted back to the same plane at interfaces. Another example of a stray light source may be radiation modes generated at bended waveguides. This type of stay light source may occur in a filter comprising micro-ring waveguide resonators, or a polarizer comprising cascade of bending waveguides. Light may become non-guided and radiated into the substrate either in the operation polarization mode or in the orthogonal polarization mode due to the bending radiations. The stray light may be recoupled by the later circuit or the neighboring components. When the recoupled light joins with the desired optic signal, an erroneous signal may be generated.

The optic system comprising a PIC may be constructed for applications that require stable output polarization state. These applications may include optic interferometric modulators, optic interferometric sensors, wavelength-division multiplexing, and coherent communication. Optic birefringence may be deliberately introduced into the components and waveguides. The waveguides and components may conduct and process light of a single linear polarization. To generate and maintain the light in a signal linear polarization state, a polarizer may be included into a PIC. One example of an optic interferometer may be a hybrid fiber optic gyroscope comprising a PIC and optic fiber coil. Another example of an optic interferometer may be an optic coherence tomographic system. Erroneous signal may be produced due to a formation of parasitic interferences. Light in radiation mode that is recoupled into the circuit may coherently interfere with the desired signal. The recoupled light that is originally in the orthogonal polarization mode may be cross coupled into the operation polarization mode and results in interference type of errors.

SUMMARY

The embodiments described herein may be directed to a photonic integrated circuit (PIC) that mitigates detrimental effects of stray light generated by one or more components of the PIC. The PIC may comprise a substrate that has an optical device integrated onto the substrate. The integrated optical device may comprise, for example, a Y-junction, a waveguide-to-optical fiber coupling, and/or a polarizer, among others. The described embodiments may be directed to apparatus configured to collect and selectively direct stray light from the optical device to a facility capable of mitigating the stray light by, for example, converting the stray light into heat, although other techniques for mitigating the stray light may alternatively be used.

A hybrid photonic integrated circuit (HPIC) may be constructed to expand the functionality of an integrated optic system. The HPIC may be constructed by bonding together several integrated chips. These integrated chips may be optic, electrooptic, or optoelectronic chips, or may be optic chips made of different materials, or optic chips fabricated with two or more different processes. Electronic chips may also be attached to optoelectronic or electrooptic chips and electrically coupled by, for example, solder bumps or wirebonds. Optic fibers may be attached to the optic, electrooptic, or optoelectronic chips. The methods of the attachment may be direct-coupling between two polished facets, using optic lens for mode conversion, shaping micro-lens at fiber tip, or fabricating surface grating coupler. Non-guided stray light may be produced in a HPIC. Stray light may be generated at the transition area where waveguides on the two bonded chips been connected.

Although adiabatic transition may be utilized, stray light may still result due to possible differences of the dimensions and effective refractive indices of the two connected waveguides. Stray light may be produced at the connection interface of end-fired coupling between two integrated chips, or between an integrated chip and an optic fiber. Scatter light may escape the core of the waveguide due to an optic misalignment of the input optic mode, or an optic mode-field mismatching of the two connected waveguides. The non-overlapped portion of the fiber mode fields may be non-guided and scattered across the area of photonic integrated circuit. An HPIC integrated with optoelectronic chips may be more susceptible to receiving erroneous signal. Components that particularly sensitive to stray light may be light generating electrooptic components such as optic amplifiers and lasers, light receiving optoelectronic components such as photodetectors, and phase sensitive components such as interferometers. Stray light, if allowed to freely propagate within the substrate and to reflect from the substrate surfaces, may interfere with the proper operation of the optic system.

A higher degree of integration of PICs or HPICs may be implemented to reduce the size, or lower the cost, of an optic system. The high degree of integration may be achievable by reducing the size of the PICs or introducing more functional components into PICs, so larger number of PICs or PICs with more functions can be fitted in a same semiconductor wafer. Optic components may be placed closer to realize the function expansion and the size reduction. However, stray light generation and reception may become more notable if the optic components are more closely located. Light scattered from one component may be readily coupled to a nearby component and generate the erroneous signal in that component, degrading its optic performance.

In one aspect, the invention may be a photonic integrated circuit (PIC), comprising an integrated optic device disposed on a substrate, an integrated optic structure disposed on the substrate around the optic device. The optic structure may comprise at least one stray light collector arranged to collect non-guided stray light produced by the integrated optic device. The optic structure may further comprise a light damper configured to receive the non-guided stray light collected by the at least one stray light collector and to mitigate the non-guided stray light.

The at least one stray light collector may further comprise a waveguide having a first end and a second end. The first end may be disposed proximal (e.g., close to but not in contact) to the integrated optic device, and the second end coupled to a secondary waveguide that conveys collected stray light to the light damper. The first end of the waveguide may be tapered to increase a mode-field size. The non-guided stray light may propagate along a path, and the at least one stray light collector may be disposed in the path so as to be aligned with a propagation direction of the stray light and configured to facilitate reception of the stray light into the first end of the waveguide.

The integrated optic structure may comprise first materials and the integrated optic device may comprise second materials. The first materials may be the same as the second materials. In other words, the integrated optic structure may be fabricated from the same materials as the integrated optic device. The integrated optic structure and the integrated optic device may be monolithically fabricated on the substrate. The integrated optic device may be bonded onto the substrate. The integrated optic device may be a light-emitting device.

The integrated optic device may comprise an integrated Y-junction. The integrated optic device may comprise an integrated polarizer that is a cascade of one or more optically-coupled bended waveguides. The integrated optic device may comprise an integrated polarizer. The polarizer may be a filter that comprises one or more micro-ring waveguide resonators. The light damper may comprise light absorptive material. The light damper may comprise metal light damping material.

In another aspect, the invention may be a photonic integrated circuit (PIC) comprising an integrated optic device disposed on a substrate, a second optic device disposed on the substrate and coupled to the integrated optic device at a coupling joint, and an integrated optic structure disposed on the substrate around the coupling joint. The optic structure may comprise at least one stray light collector arranged to collect non-guided stray light produced by one or more of (i) the integrated optic device, (ii) the second optic device, and (iii) the coupling joint. The optic structure may further comprise a light damper configured to receive the non-guided stray light collected by the at least one stray light collector and to mitigate the non-guided stray light.

The at least one stray light collector may further comprise a waveguide that has a first end and a second end. The first end may be disposed proximal to the integrated optic device, the second optic device, and the coupling joint. The second end may be coupled to a secondary waveguide that conveys collected stray light to the light damper.

The first end of the waveguide may be tapered to increase a mode-field size.

The non-guided stray light may propagate along a path. The at least one stray light collector may be disposed in the path so as to be aligned with a propagation direction of the stray light and configured to facilitate reception of the stray light into the first end of the waveguide.

In another aspect, the invention may be a method of mitigating stray light generated on a photonic integrated circuit (PIC), comprising collecting, through at least one stray light collector, non-guided stray light produced by an integrated optic device disposed on a substrate of the PIC. The method may further comprise conveying, by the at least one stray light collector, the collected stray light to a light damper configured to receive the non-guided stray light collected by the at least one stray light collector and to mitigate the non-guided stray light.

The method may further comprise disposing the at least one stray light collector in a path along which the stray light propagates. The at least one stray light collector may be aligned with a propagation direction of the stray light.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 1C is a top view of the Y-junction of a PIC according to embodiments of the invention, with stray light collectors placed in the recommended places and directions.

FIG. 1D is a top view of a light intensity distribution within and nearby the Y-junction with stray light collectors shown in FIG. 1C.

FIG. 4C is a top view of the optic component according to embodiments of the invention, with stray light collector waveguides placed in the recommended places and directions.

FIG. 4D is a top view of the light intensity distribution within and nearby the optic component with stray light collectors shown in FIG. 4C.

DETAILED DESCRIPTION

A description of example embodiments follows.

The teachings of all patents, published applications and references cited herein are incorporated by reference in their entirety.

A photonic integrated circuit (PIC) may comprise a substrate that has an optical device integrated onto the substrate. The integrated optical device may comprise, for example, a Y-junction, a waveguide-to-optical fiber coupling, and/or a polarizer, among others. The described embodiments may be directed to apparatus configured to collect and selectively direct stray light from the optical device to a facility capable of mitigating the stray light by, for example, converting the stray light into heat, although other techniques for mitigating the stray light may alternatively be used.

Figure 1A:
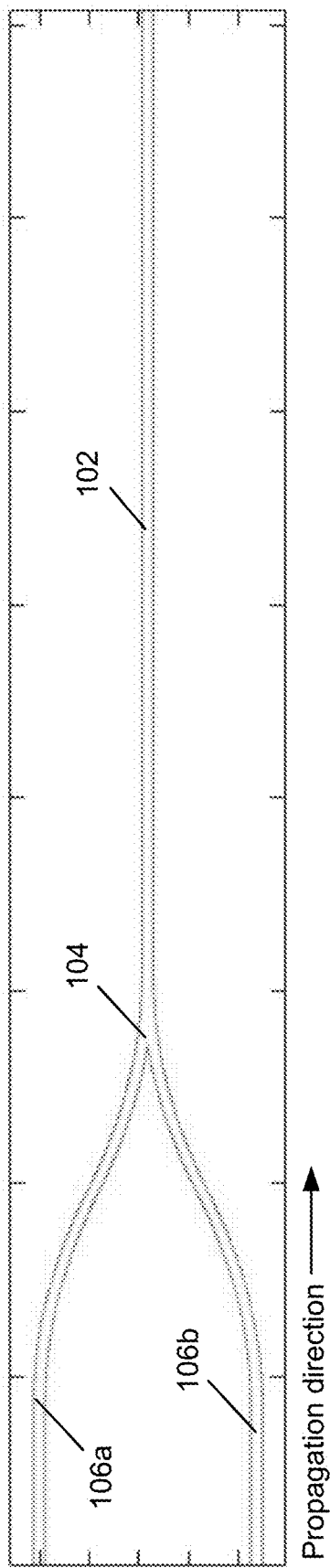
FIG. 1A is a top view of a conventional Y-junction of a photonic integrated circuit.
Figure 1B:
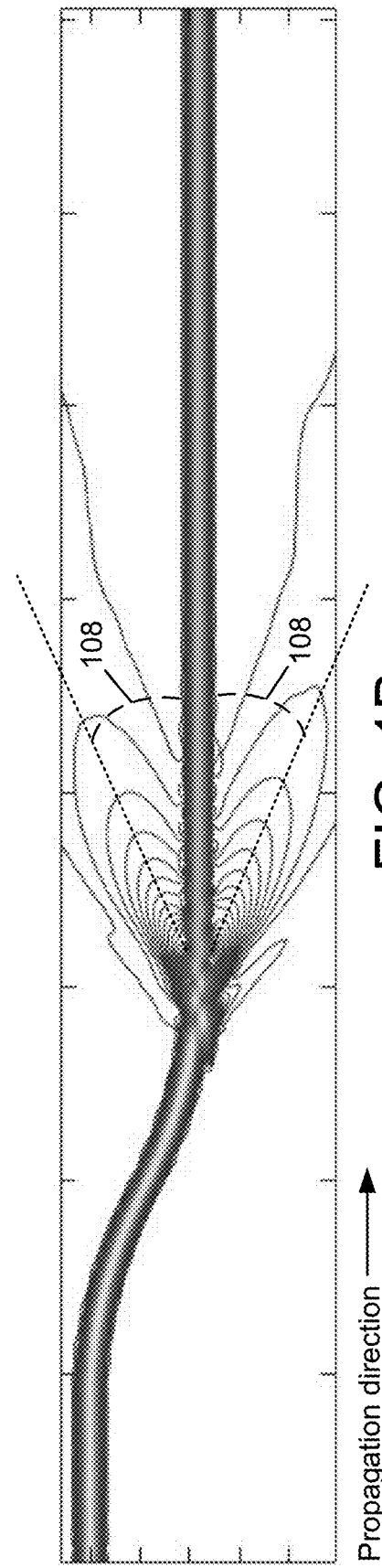
FIG. 1B is a top view of a light intensity distribution within and nearby the conventional Y-junction shown in FIG. 1A.

Referring to FIG. 1A, a photonic integrated circuit may have a Y-junction, built on a substrate, that comprises a common base waveguide 102, a splitting waveguide structure, and two branch waveguides 106a, 106b. The light propagating in one of the branch waveguide from left to right. At the splitting waveguide structure 104, part of the light power may continue to be guided and propagating in the common base waveguide in a single mode if the waveguide is a single mode waveguide. Another part of the optic power of the input light may be in an asymmetrical mode after passing through the splitting waveguide structure 104 and is not guided but is rather radiated out from the waveguide into the substrate. FIG. 1B shows a two-dimensional contour plot of the light power distribution in the Y-junction area, including the light in asymmetric mode radiated out from the splitting waveguide structure. The non-guided stray light spreads out along angles 108 above and below the common base waveguide 102. The radiation light may be recoupled or received by the any components in the path of the radiation, which may add erroneous signal to the desired signal. It is desirable, therefore, to prevent the stray light from reaching such in-path circuits or neighboring components. Various techniques have been suggested to suppress stray light, including deep etched trenches filled with an absorbing material, light shield built with metal walls and doped semiconductor regions, the open mouth of an optical trap, and light absorbing films.

In the described embodiments, an integrated Y-junction may be built on a substrate with an array of collectors. The array of collectors 110 may be made from the same materials and fabricated with the same processes as the main circuit waveguide structure. The array of collectors 110 may be arranged such that the collectors are aligned in the direction that the stray light is radiated out from the junction, depicted in FIG. 1B. The array of collectors 110 may be directed as fanning out, as shown in FIG. 1C. The tips of the collectors that are directed to the junction area may be optimized into a shape to improve the efficiency for receiving the stray light.

Tapering the tips of the collectors may enlarge the mode-field size at the waveguide tips of the collectors 110, so that the collectors 110 operate as efficient "antennas" for the signal collections. The mode-field size may be enlarged by using the forward taper, which has a waveguide core increased gradually in size at the waveguide tip either in horizontal, or in vertical direction or in both directions. The mode-field size may also be enlarged by using an inverse taper, in which the waveguide core is reduced gradually in size either in the horizontal direction, or in vertical direction, or in both directions.

A forward taper may be used to increase the mode-size when the index difference of refractions (Δn) between the core and cladding materials is small, such as Δn<0.1, so the increase of waveguide core size may not readily facilitate supporting a high-order mode, which would increase the propagation loss. On the other hand, an inverse taper is often used in a waveguide that has a large index difference between the core material and the cladding material, such as Δn larger than 0.5. Examples of such waveguides may include a waveguide with silicon nitride core and silicon oxide cladding or a silicon-on-insulator (SOI) waveguide.

Figure 2:
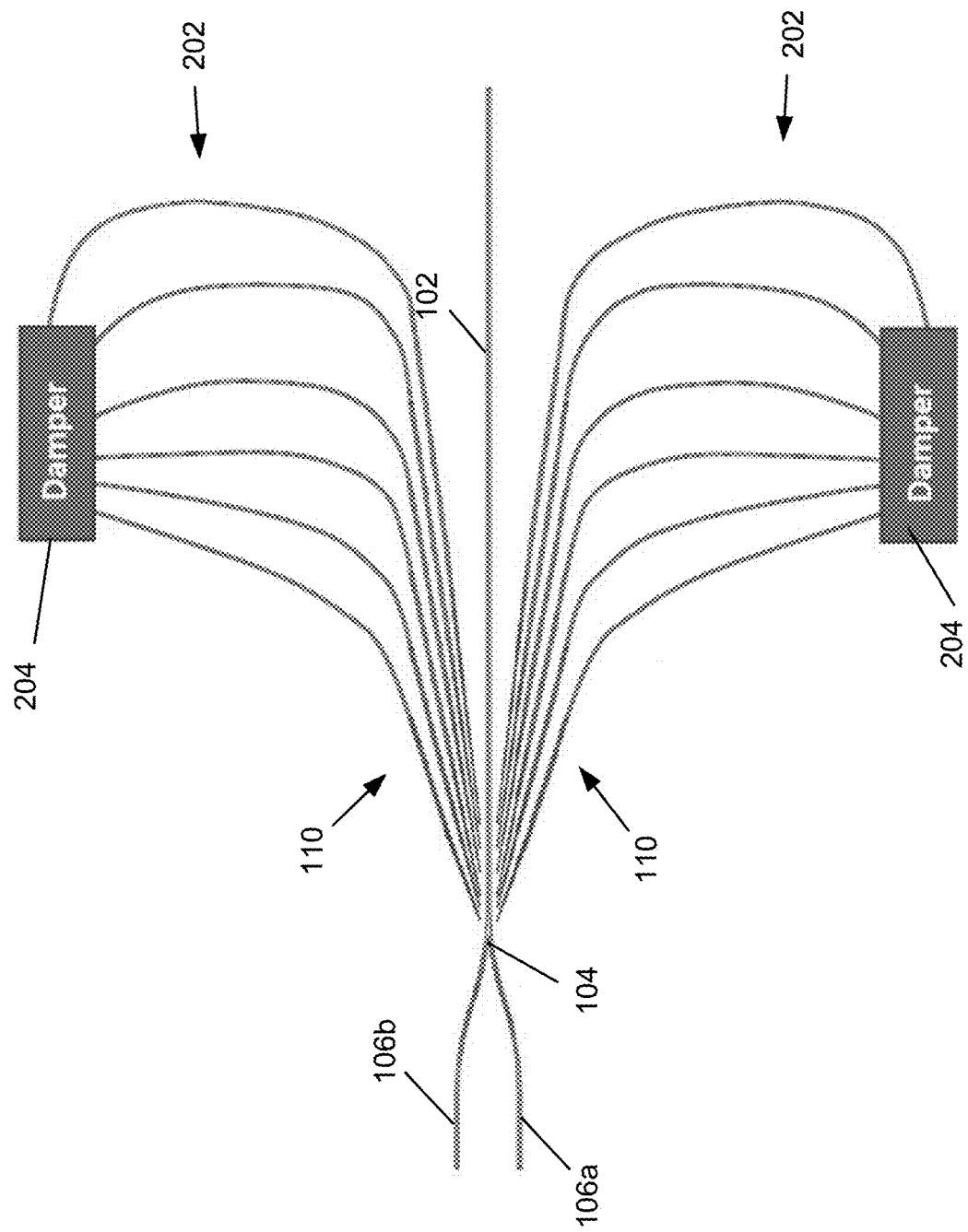
FIG. 2 is a top view of a PIC device comprising a Y-junction with stray light collectors shown in FIG. 1C, a series of second waveguides, and light dampers.
Figure 3A:
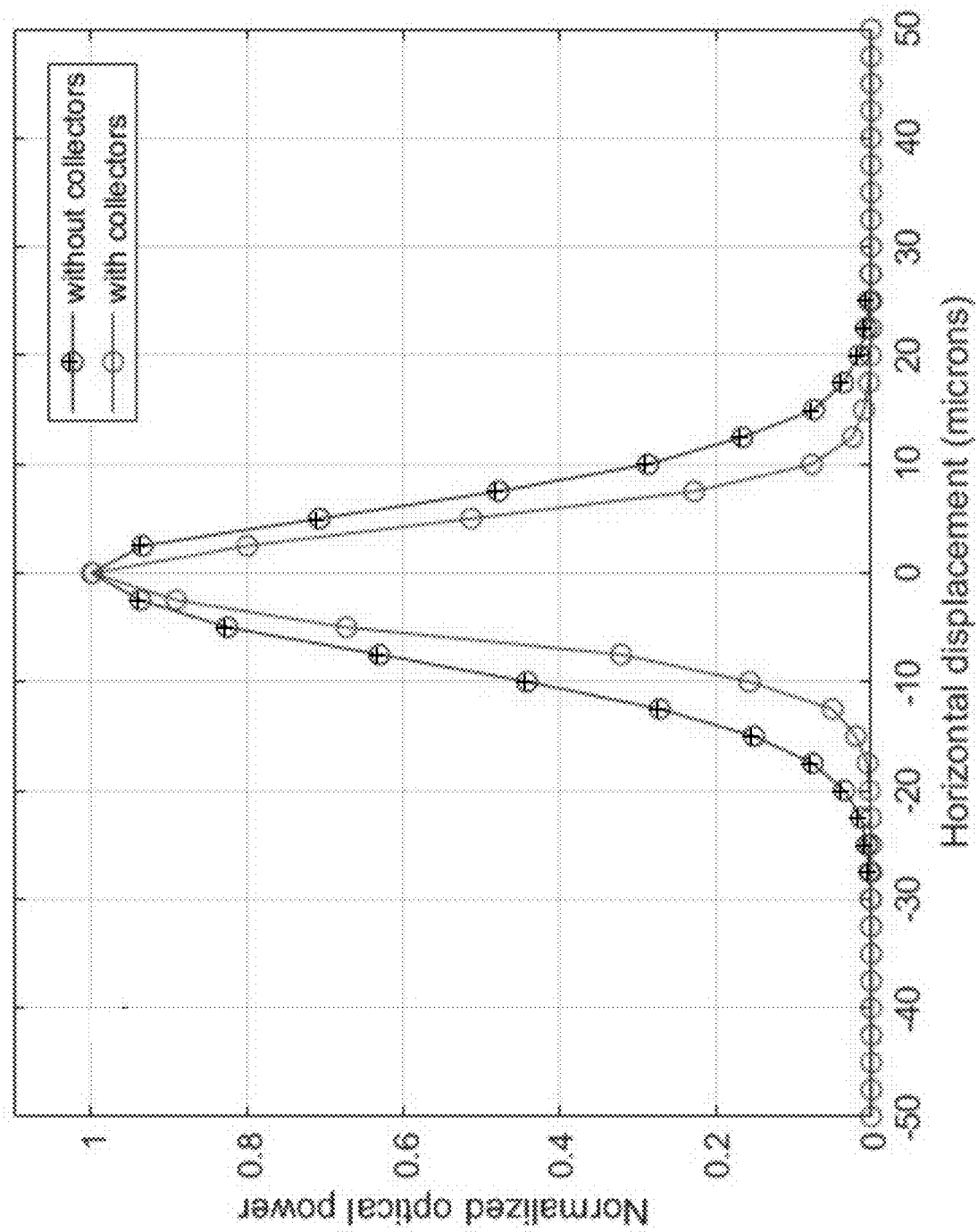
FIGS. 3A and 3B are examples of test results of stray light suppression on a Y-junction according to embodiments of the invention.
Figure 3B:
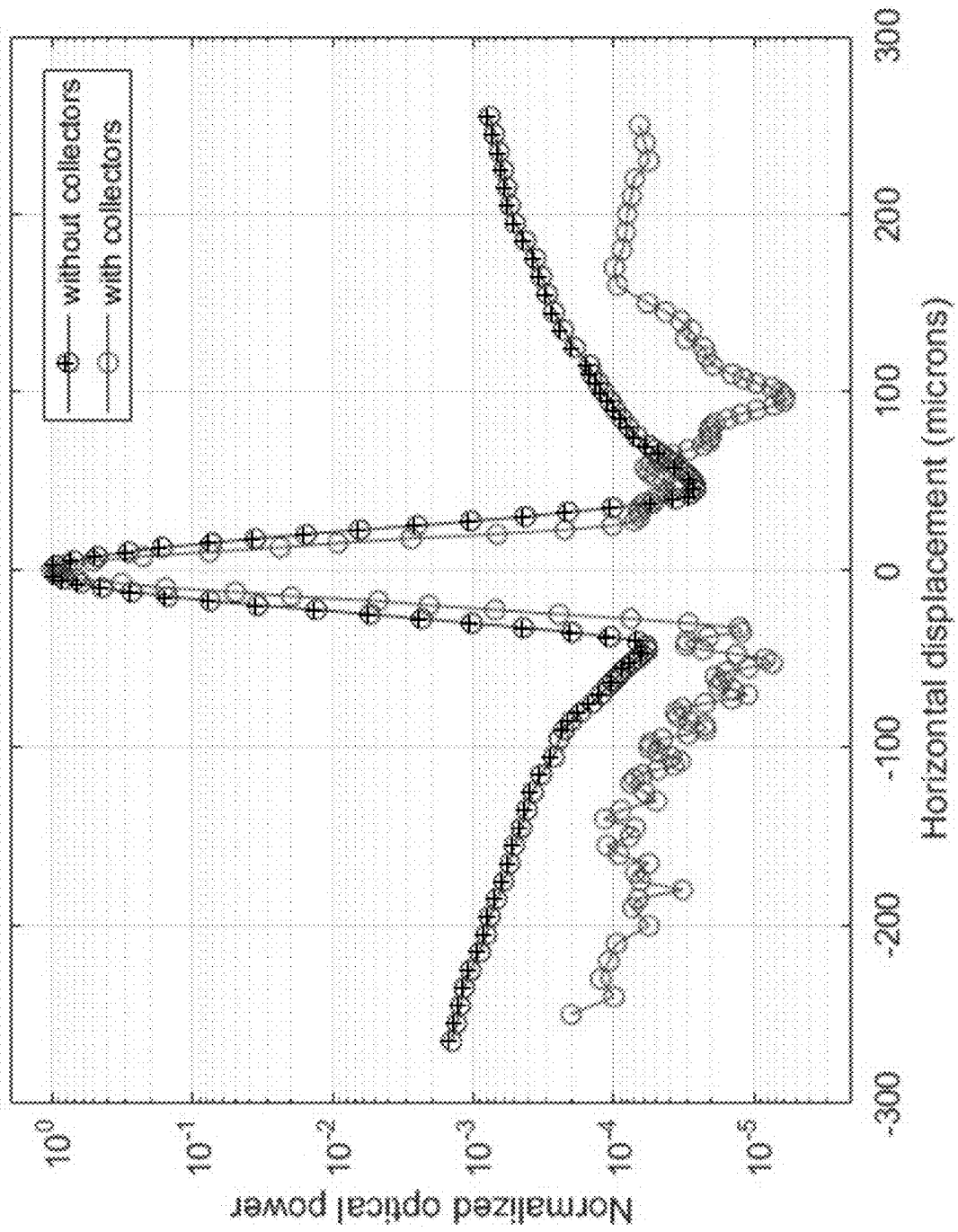

The non-guided light that is sourced at the junction 104 may be collected and guided by the array of the waveguide collectors 110, as demonstrated by the contour plot of the light power distribution shown in FIG. 1D. The stray light collected by the waveguide collectors 110 may be further guided by secondary waveguides 202 towards damping areas 204, where the light energy may be converted into heat and dissipated thermal-conductively, as shown in FIG. 2. The optic dampers 204 may comprise an area where the evanescent waves of each of the secondary waveguides 202 are exposed for a length/at the ends of the waveguides 202, and light energy absorptive material being filled in the exposed area so that the exposed waveguide sections are covered with the absorptive material. More than 20 dB suppression of the stray light may be achievable using the collectors 110 of the described embodiments. As shown in FIGS. 3A and 3B, approximately 12 dB suppression of the stray light was measured on an example ultrathin silicon nitride waveguide after placing six collectors on each side of a Y-junction.

Figure 4A:
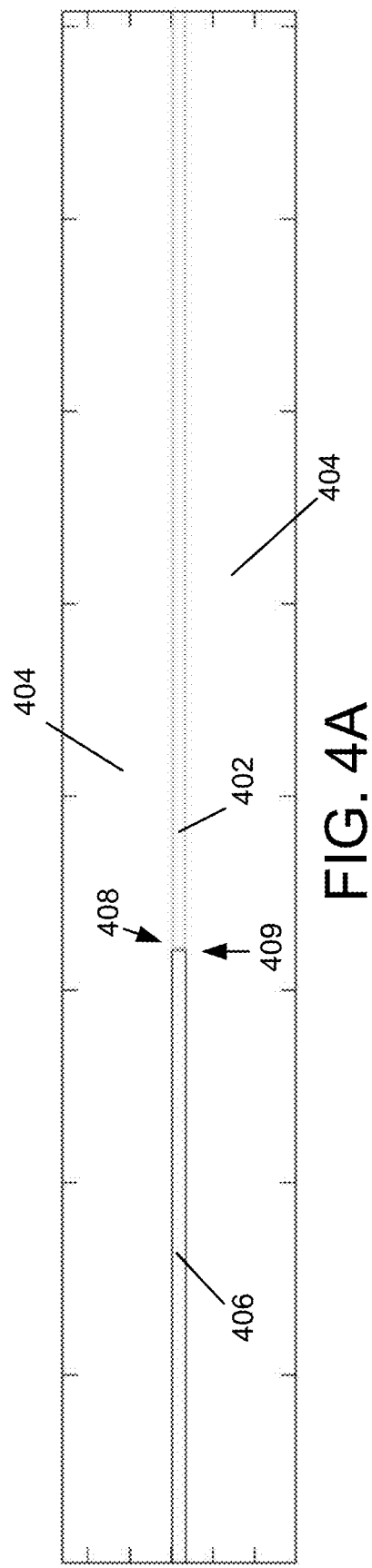
FIG. 4A is a top view of a conventional optic component that comprises a PIC having a waveguide built on a substrate and an optic fiber.
Figure 4B:
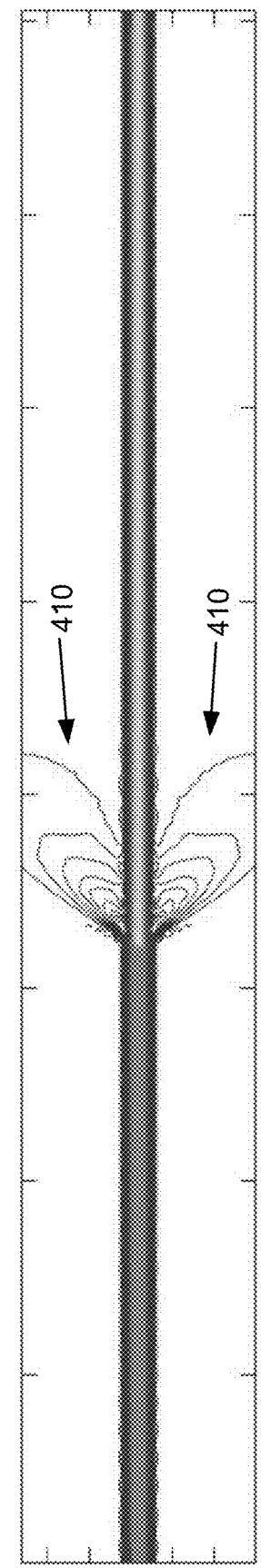
FIG. 4B is a top view of the light intensity distribution within and nearby the conventional optic component shown in FIG. 4A.

Referring to FIG. 4A, an example embodiment of a PIC may comprise a photonic integrated circuit having a waveguide 402 built on a substrate 404 and an optic fiber 406. The waveguide 402 may have its end 408 optimized to connect to the optic fiber 406. The mode-field dimensions of the integrated waveguide 402 and the fiber 406 may not be matching and, therefore, non-guided stray light 410 may radiate out from the waveguide-fiber joint point 409 into the cladding layer of waveguides and substrate 404 of the PIC, as shown in a simulated result in FIG. 4B. The radiated stray light 410 (shown in FIG. 4B as a two-dimensional contour plot of the light power distribution near the waveguide-fiber joint point 409) may be recoupled by any components or waveguides in the path of the propagation, which may add erroneous single to the desired signal. It is desirable, therefore, to prevent the stray light from reach to the later circuit or the neighboring components. A PIC of described embodiments may have an array of collectors 420 that may be made from the same materials and fabricated using the same processes as the waveguides 402 of the main optic circuit. The collectors 420 may be arranged in such a way that the collectors 420 are aligned in the direction that the stray light radiates out from the joint point 409. A plurality of collectors may be employed so that the collectors 420 may be arranged in a fanned-out configuration, as shown in FIG. 4C. As with the collectors 110 associated with the Y-junction configuration described with respect to FIGS. 1A through 1D, the tips of the collectors 412 that are arranged to be pointing to the joint point may be optimized into a shape to improve the efficiency for receiving the radiated stray light. As was described with respect to the Y-junction configuration of FIGS. 1A through 1D, tapering the tips of the collectors 412 may be beneficial due to the enlarged mode-field size that occurs at the tips of the collectors. The mode-field size may be enlarged by using the forward taper or may be enlarged by using an inverse taper. The non-guided light generated at the joint point 409 may then be collected by the waveguide collector array 412, as shown in FIG. 4D. The stray light collected by the waveguide collector array 412 may be guided continuously by secondary waveguides, which are linking to the back ends of the collector waveguides respectively, and led towards damping areas where absorption materials may be utilized, such as the dampers 204 depicted in FIG. 2 with respect to the Y-junction arrangement. More than 20 dB suppression of the stray light may be achievable by using the collector arrays of the described embodiments.

Figure 5:
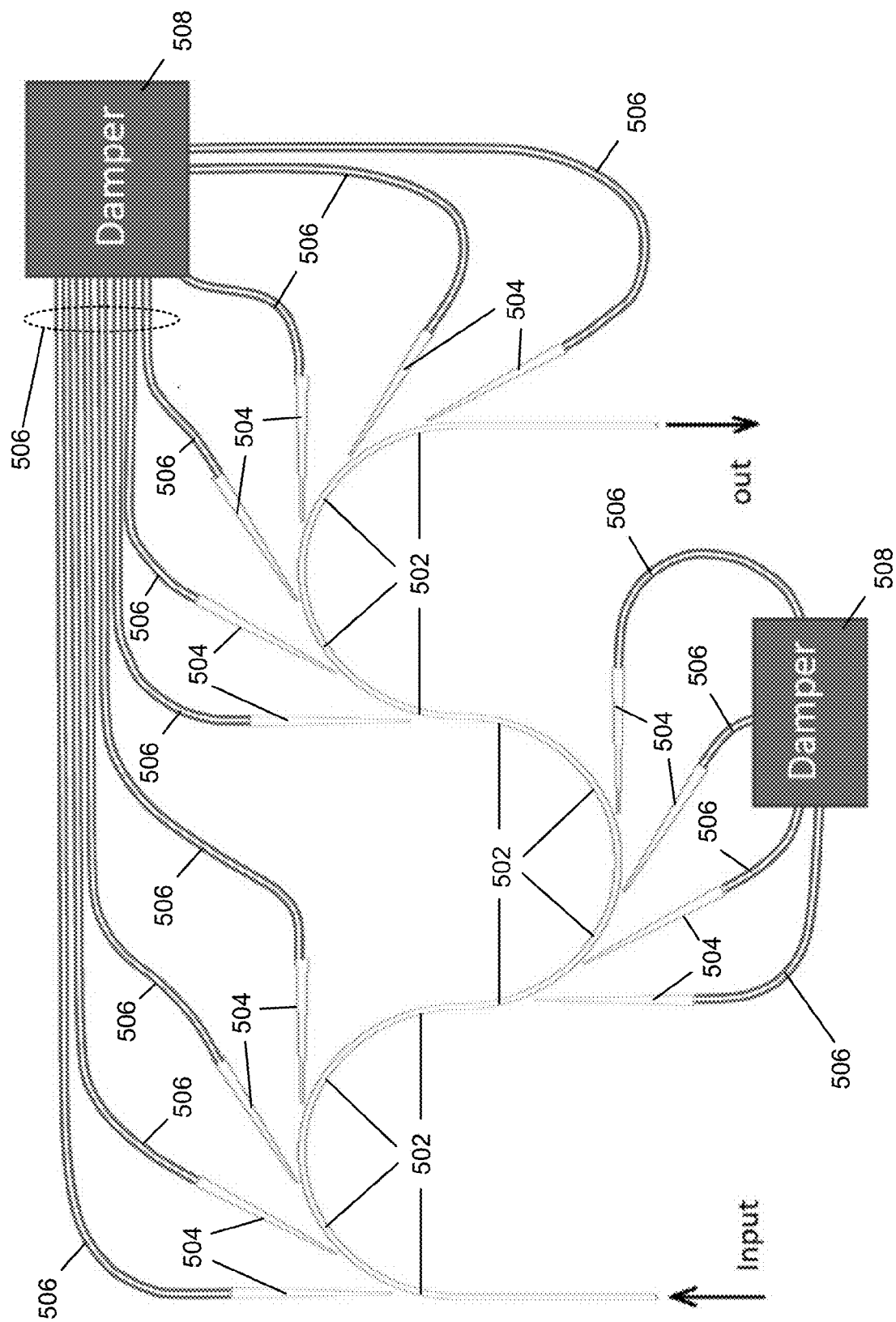
FIG. 5 is a top view of a m-shaped integrated waveguide polarizer with stray light collectors, according to embodiments of the invention.

Turning now to FIG. 5, an example embodiment of a PIC may comprise a birefringent waveguide, or a cascade of birefringent waveguides, each being curved at least to some extent. In the example embodiment of FIG. 5, the waveguides 502 are in the shape of a half circle, although other curved arrangements may alternatively be used. The example waveguides 502 may be built on a substrate and arranged to be coupled in series, as shown in FIG. 5, to form an "m" shape. The birefringence of the waveguides 502 may result in a higher confinement on light propagating in a transverse electric (TE) polarization mode than light propagating in a transverse magnetic (TM) mode. The radius of each of the half circle waveguides 502 may be optimized to such that the waveguides 502 guide the TE polarization light with a low propagation loss, while imposes a large bending loss to the light in TM mode. The series of the half circles, therefore, cumulatively constitute a polarizer with a high propagation extinction ratio (PER).

The actual achievable PER of such an integrated polarizer may, however, be limited. At the bending waveguides 502, the TM polarization-mode light may be not completely guided by the waveguide 502 and may be radiated into the substrate and cladding layer of the waveguides 502. The non-guided light may be recoupled back into the optic circuit, which may add light power in the TM mode of the waveguide, and effectively degrade the polarizer. A series of the collector waveguides 504 may be placed along side with the curved waveguide sections 502 as indicated in FIG. 5. The collector waveguides 504 may be aligned in the direction of the tangent lines of the curvature of the polarizer waveguide. As for the collectors described with respect to FIGS. 1C and 4C, the tips of collectors 504 may be optimized in shape to improve the efficiency for receiving the coming stray light. Tapering the tips of the collectors may utilized to enlarge the mode-field size at the tip of the collectors. The mode-field size may be enlarged by using the forward taper or may be enlarged by using an inverse taper. The stray light collected by the waveguide collectors 504 may be guided by secondary waveguides 506 towards damping areas 508, where absorption materials may be utilized.

While example embodiments have been particularly shown and described, it will be understood by those skilled in the art that various changes in form and details may be made therein without departing from the scope of the embodiments encompassed by the appended claims.

What is claimed is:

1. A photonic integrated circuit (PIC), comprising:
an integrated optic device disposed on a substrate; and
an integrated optic structure disposed on the substrate around the integrated optic device, the integrated optic structure comprising:
at least one stray light collector comprising a waveguide having a first end and a second end, the first end disposed proximal to the integrated optic device, and the second end coupled to a secondary waveguide that conveys collected stray light to the light damper, the at least one stray light collector having a directionality that is oriented towards non-guided stray light that is sourced by the integrated optic device; and
a light damper configured to receive the non-guided stray light collected by the at least one stray light collector and to mitigate the non-guided stray light.

2. The PIC of claim 1, wherein the first end of the waveguide is tapered to increase a mode-field size.

3. The PIC of claim 1, wherein the non-guided stray light propagates along a path, and the at least one stray light collector is disposed in the path so as to be aligned with a propagation direction of the non-guided stray light and configured to facilitate reception of the non-guided stray light into the first end of the waveguide.

4. The PIC of claim 1, wherein the integrated optic structure comprises first materials, the integrated optic device comprises second materials, and the first materials are same as the second materials.

5. The PIC of claim 1, wherein the integrated optic structure and the integrated optic device are monolithically fabricated on the substrate.

6. The PIC of claim 1, wherein the integrated optic device is bonded onto the substrate.

7. The PIC of claim 6, wherein the integrated optic device is a light-emitting device.

8. The PIC of claim 1, wherein the integrated optic device comprises an integrated Y-junction.

9. The PIC of claim 1, wherein the integrated optic device comprises an integrated polarizer that is a cascade of one or more optically-coupled bended waveguides.

10. The PIC of claim 1, wherein the integrated optic device comprises an integrated polarizer, and wherein the integrated polarizer is a filter that comprises one or more micro-ring waveguide resonators.

11. The PIC of claim 1, wherein the light damper comprises light absorptive material.

12. The PIC of claim 1, wherein the light damper comprises metal material.

* * * * *